(12) United States Patent
Eisert et al.

(10) Patent No.: US 7,557,381 B2
(45) Date of Patent: Jul. 7, 2009

(54) SEMICONDUCTOR COMPONENT

(75) Inventors: Dominik Eisert, Regensburg (DE);
Stefen Illek, Donaustauf (DE);
Wolfgang Schmid, Deuerling/Hillohe (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 0 days.

(21) Appl. No.: 11/731,914

(22) Filed: Apr. 2, 2007

(65) Prior Publication Data
US 2007/0181891 A1    Aug. 9, 2007

Related U.S. Application Data

(62) Division of application No. 10/529,673, filed as application No. PCT/DE03/02954 on Sep. 5, 2003, now Pat. No. 7,208,337.

(30) Foreign Application Priority Data
Sep. 30, 2002    (DE) ................... 102 45 631

(51) Int. Cl.
H01L 27/15    (2006.01)
(52) U.S. Cl. .................. 257/81; 257/82; 257/99; 257/E33.012
(58) Field of Classification Search .......... 257/82, 257/E33.012, 81, 99
See application file for complete search history.

(56) References Cited

U.S. PATENT DOCUMENTS

| 4,862,239 | A | | 8/1989 | Broich et al. |
|---|---|---|---|---|
| 5,461,637 | A | * | 10/1995 | Mooradian et al. ............. 372/92 |
| 5,903,583 | A | | 5/1999 | Ullman et al. |
| 6,172,382 | B1 | | 1/2001 | Nagahama et al. |
| 6,335,546 | B1 | | 1/2002 | Tsuda et al. |
| 6,403,985 | B1 | | 6/2002 | Fan et al. |
| 2001/0004534 | A1 | | 6/2001 | Carter-Coman et al. |
| 2001/0042866 | A1 | | 11/2001 | Coman et al. |
| 2001/0050376 | A1 | | 12/2001 | Asami et al. |
| 2002/0137244 | A1 | | 9/2002 | Chen et al. |
| 2003/0022465 | A1 | | 1/2003 | Wachtler |

(Continued)

FOREIGN PATENT DOCUMENTS

CN    1249853    4/2000

(Continued)

OTHER PUBLICATIONS

Datenblatt micro resist technology: "ma-P 100-Thick Positive Photoresist for Optical Lithography".

(Continued)

*Primary Examiner*—Hsien-ming Lee
(74) *Attorney, Agent, or Firm*—Cohen Pontani Lieberman & Pavane LLP

(57) ABSTRACT

A semiconductor component having a light-emitting semiconductor layer or a light-emitting semiconductor element, two contact locations and a vertically or horizontally patterned carrier substrate, and a method for producing a semiconductor component are disclosed for the purpose of reducing or compensating for the thermal stresses in the component. The thermal stresses arise as a result of temperature changes during processing and during operation and on account of the different expansion coefficients of the semiconductor and carrier substrate. The carrier substrate is patterned in such a way that the thermal stresses are reduced or compensated for sufficiently to ensure that the component does not fail.

19 Claims, 17 Drawing Sheets

U.S. PATENT DOCUMENTS

| | | |
|---|---|---|
| 2003/0183835 A1 | 10/2003 | Yanagihara et al. |
| 2004/0056254 A1 | 3/2004 | Bader et al. |

FOREIGN PATENT DOCUMENTS

| | | |
|---|---|---|
| DE | 198 21 544 A1 | 12/1999 |
| DE | 199 05 517 A | 12/1999 |
| DE | 195 06 093 C2 | 12/2000 |
| DE | 100 17 336 A1 | 10/2001 |
| DE | 100 20 464 A1 | 11/2001 |
| DE | 100 40 448 A | 3/2002 |
| DE | 196 46 476 C2 | 3/2002 |
| EP | 0 184 117 A | 6/1986 |
| EP | 0 590 232 A1 | 3/1993 |
| JP | 06112596 | 4/1994 |
| WO | WO 01/41225 A | 6/2001 |
| WO | WO 01/61766 A | 8/2001 |

OTHER PUBLICATIONS

W. Schmid, "Hocheffiziente Leuchtdioden mit lateralem Auskoppeltaper: Konzept, Herstellung und Eigenschaften", VDI Verlag. Reihe 9, No. 347, pp. 70-75.

Datenblatt www.orioline.com: "About Oriol", 2001, Oriol Inc., Jun. 14, 2002.

Datenblatt www.nanopierce.com: "The NanoPierce Connection system (NCS)", Jun. 14, 2002.

MichroChem Corp.: "Nano TM SU-8 Negative Tone Photoresists Formulations 50 & 100", www.microchem.com Rev. Jan. 2001.

Japanese Examination Report (in German) issued in the corresponding foreign application.

Naoki Wada et al., "Stable Operation of AlGaAs/GaAs Light-Emitting Diodes Fabricated on Si Substrate" Japanese Journal of Applied Physics, vol. 31, Nr. 2A Part 2, pp. L78-L81, Feb. 1, 1992.

Wada N. et al., "GaAs/AlGaAs Light Emmitters Fabricated on Undercut GaAs on Si", Japanese Journal of Applied Physics, vol. 33, Nr. 3A, pp. 1268-1274, Mar. 1, 1994.

Olsen et al., "Calculated stresses in multilayered heteroepitaxial structures", Journal of Applied Physics, vol. 48, Nr. 6, pp. 2543-2547 (Jun. 1977).

* cited by examiner

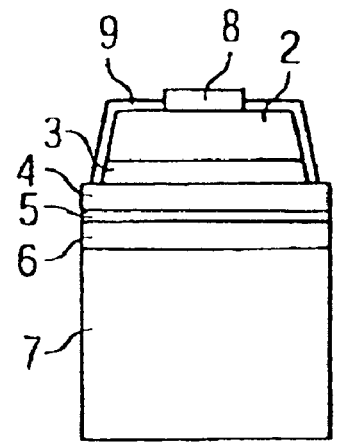
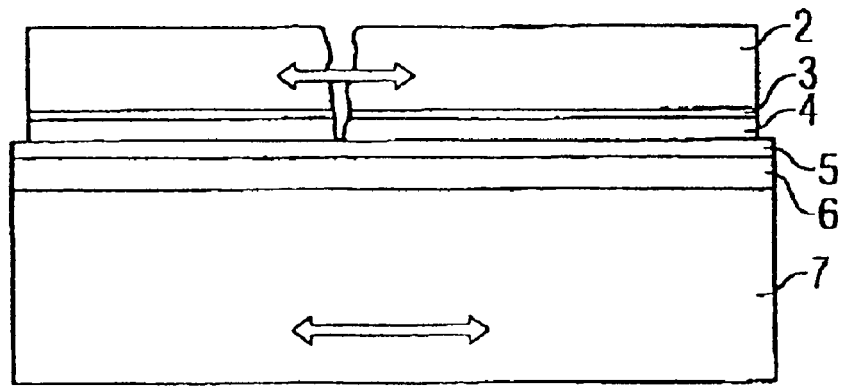
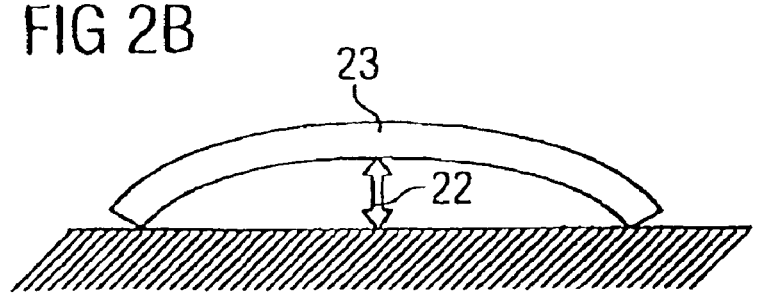

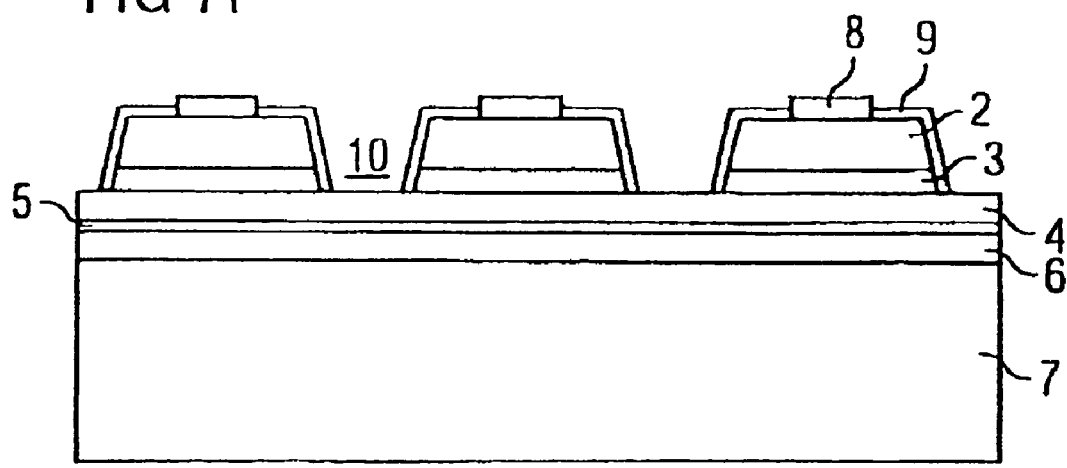
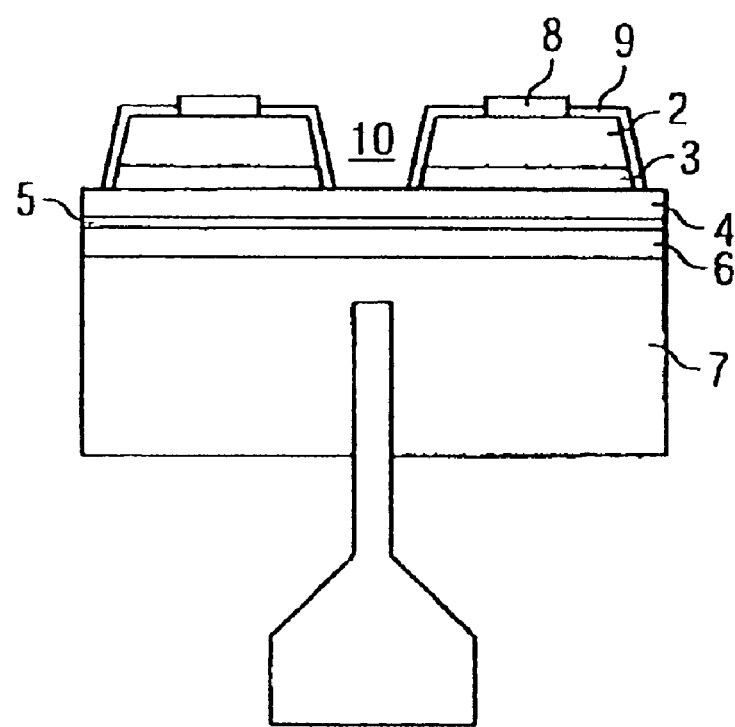

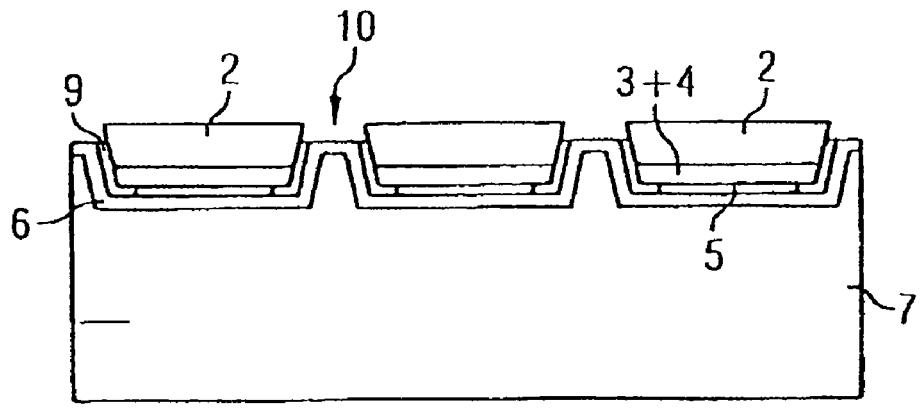
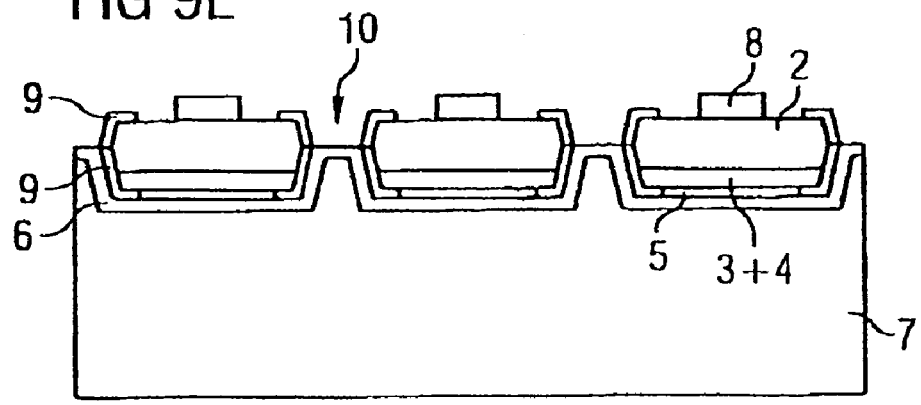
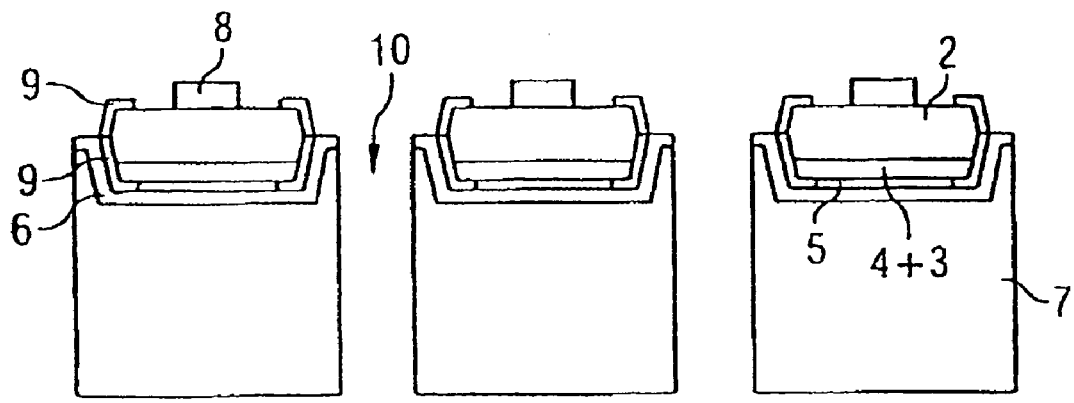

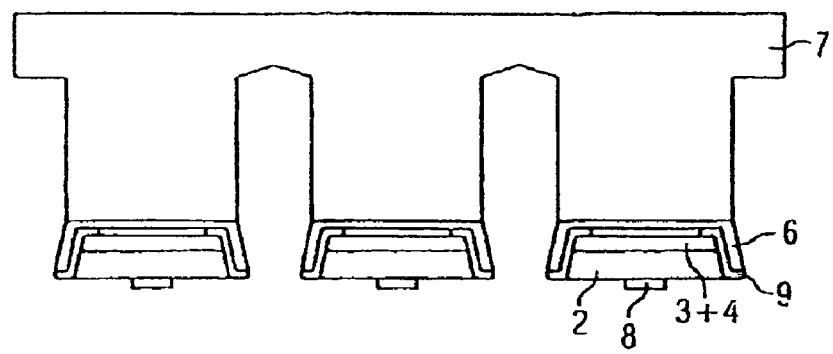
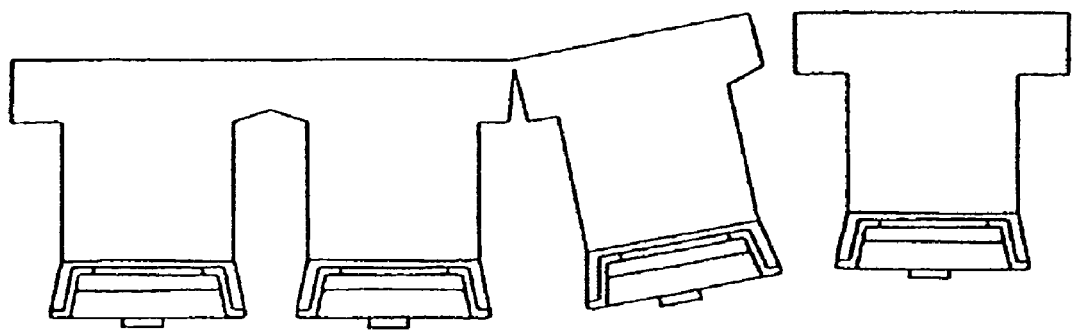

SEMICONDUCTOR COMPONENT

CROSS-REFERENCE TO RELATED APPLICATIONS

The present application is a divisional of application Ser. No. 10/529,673, filed Nov. 22, 2005, now U.S. Pat. No. 7,208,337 issued Apr. 24, 2007; which is U.S. national stage of International Application No. PCT/DE2003/002954, filed Sep. 5, 2003. This patent application claims the priority of German patent Application No. 102 45 631.3, filed Sep. 30, 2002, the disclosure content of which is hereby incorporated by reference.

BACKGROUND OF THE INVENTION

1. Field of the Invention

The invention relates to a semiconductor component and a method for producing a semiconductor component having a light-emitting semiconductor layer or a light-emitting semiconductor element and two contact locations, which are formed as a contact layer and a contact.

2. Description of the Related Art

Such a component is disclosed in published US Patent Application No. 2004/0099873, for example, which describes a semiconductor chip having contact locations on both sides and a reinforcing layer, which semiconductor chip is reinforced by a thick contact layer and the reinforcing layer sufficiently to ensure that no carrier body is required for mechanically stabilizing the chip. An area-covering auxiliary carrier layer, which can be removed selectively with respect to the reinforcing layer, is additionally applied to the reinforcing layer. The selective removal of the auxiliary carrier layer enables the chips to be singulated without a sawing process.

What is disadvantageous about components of this type is the sensitivity of the component to changing temperatures during the production process and during operation. These lead to thermal stresses between the relatively sensitive semiconductor layer and the carrier body, which usually has a higher expansion coefficient than the semiconductor layer. In the event of heating, the carrier substrate expands to a greater extent than the semiconductor and the component flexes up as a consequence. Such thermal stresses may cause cracks in the semiconductor, which leads to the failure of the component.

SUMMARY OF THE INVENTION

One object of the present invention is to provide a semiconductor component of the type mentioned in the introduction which reduces the thermal stresses between the semiconductor layer and the carrier body or substrate.

Another object of the invention is to provide a method for producing semiconductor components (including the type mentioned above but not restricted thereto) in which more rapid fabrication of the component and a more reliable end product are achieved.

These and other objects are attained in accordance with one aspect of the present invention directed to a semiconductor component having a light-emitting semiconductor layer or a light-emitting semiconductor element and two contact locations, wherein the component is arranged on a carrier substrate and the carrier substrate is patterned vertically or horizontally.

In one preferred embodiment, the carrier substrate has vertical structure elements and a carrier base. The vertical structure elements are situated on the carrier base and are separated from one another by interspaces. The vertical structure elements connect the carrier base to the semiconductor layer or the contact layer or a wetting layer. If the carrier substrate then expands to a greater extent than the semiconductor, the difference in expansion can be compensated for by flexure of the structure elements. Although the semiconductor layer will also bend, it is no longer subjected to the same high degree of tensile loading as would be the case with a homogeneous, unpatterned carrier substrate.

The carrier substrate is preferably formed in one piece. In one piece is understood to mean, with regard to the carrier substrate, in particular that the carrier substrate is not formed from different layers, or that the carrier substrate has a composition that is as homogeneous as possible.

The interspaces may advantageously be filled with a filling material that is more elastic than the carrier substrate material. This improves the stability of the component without impairing the ability of the patterned carrier substrate to absorb thermal stresses.

A further preferred embodiment has an individual vertical structure element that is arranged below the center of the semiconductor layer or element. This structure element serves as a stable core of the component and is limited in size in cross section parallel to the carrier base in such a way that thermal strains still do not lead to failures. The external space around the individual structure element is filled with a softer or more elastic material that can take up the thermal strains and additionally dissipate the heat from the semiconductor element.

In the above embodiments, the thermal stresses can additionally be reduced by selection of a carrier substrate material whose expansion coefficient is as close as possible to that of the semiconductor layer.

In a further embodiment, the carrier substrate has a multilayer structure. This layer sequence comprises materials having different expansion coefficients and modulus of elasticity. At least one additional carrier substrate layer is applied or laminated onto the underside of the first carrier substrate in order to compensate for the tension on the top side of the first carrier substrate. The top side of the first carrier substrate is situated closer to the semiconductor layer than the underside. Since the layers are fixedly connected to one another, they must expand to the same length. On account of the different expansion coefficients of the semiconductor and of the carrier substrate and therefore the different linear expansion, bending moments arise about a neutral axis of the layer assembly in the event of heating. In order to reduce flexure, the layers are to be coordinated with one another in terms of thickness in such a way that the bending moments of each layer including the semiconductor layer add up virtually to zero, i.e. the bending moments must cancel each other out. The following rule holds true as a condition for planarity:

$$0 = \Sigma z_i E_i d_i \alpha_i T$$

where $z_i$ is the distance between the neutral axis and element i, $E_i$ is Hooke's modulus of elasticity of the element i, $d_i$ is the thickness of the element i, $\alpha_i$ is the thermal expansion coefficient of the element i, and T is the temperature of the component.

In practice, it also suffices if the equation adds up virtually to zero, namely:

$$0 \approx \Sigma z_i E_i d_i \alpha_i T$$

Another aspect of the present invention is directed to a method for producing a semiconductor component which includes the following method steps:

(a) epitaxial deposition of a light-emitting semiconductor layer on a growth substrate, (b) provision of the semiconductor layer with a metallic contact layer, (c) production of an adhesion and wetting layer at least above the metallic contact layer, (d) application, production or deposition of a mechanically stable carrier substrate onto the adhesion and wetting layer, (e) separation of the semiconductor layer from the growth substrate, (f) etching of mesa trenches for the definition of individual chips between the mesa trenches, the mesa trenches at least extending through the entire semiconductor layer and the entire contact layer, (g) application of an electrical contact on the semiconductor layer, and (h) singulation of the chips by separation along the mesa trenches.

In a further embodiment, method step (f) is carried out before method step (c).

The production or the deposition of a mechanically stable carrier substrate on the adhesion and wetting layer in accordance with method step (d) is preferably carried out by means of a galvanic, method. This has the advantage that it is possible to compensate for small unevennesses in the surface of the wetting layer without constituting problems with adhesion.

Such unevennesses may pose problems in conventional connection techniques. The application of the carrier substrate by means of Van der Waals bonding requires for example extremely smooth surfaces in order that the atomic forces can act. By contrast, although adhesive bonding can compensate for larger height differences, it usually requires organic materials that are not temperature- or solvent-resistant. However, such materials have a low conductivity for heat and electric current.

Soldering methods for application of the carrier substrate have none of the abovementioned problems, but are sensitive to contaminants. A disturbance in the wetting layer may for example have the effect that the solder does not adhere at this location and withdraws. Likewise, relatively large impurity particles have the effect that the solder cannot completely fill the gap. The affected region may be much larger than the particle in this case. Disturbances in the microstructure of the solder are a further possible source of faults. They are governed by the metallurgy of the solder and are not harmful, in principle, unless the structure is subjected to severe and non-uniform mechanical or thermal loading in particular during the separation of the growth substrate. Such loading does not occur in the case of the conventional III/V material systems because the growth substrate can be removed wet-chemically by etching.

By contrast, only separation methods having high thermal (e.g. laser lift-off) and mechanical (e.g. crack separation) loading have been employed hitherto in the case of semiconductors made of nitrides. In such cases, the solder connection between the semiconductor layer and the carrier substrate is subjected to a greater loading and is therefore susceptive to the problems mentioned above. In the event of mechanical separation, it can happen that a weakening of the solder connection may induce a parasitic crack progression in the solder layer and thus impair the adhesion of the semiconductor on the carrier substrate. In the event of laser lift-off, the semiconductor (the nitride) is locally decomposed thermally by the laser bombardment at the interface between growth substrate and nitride. Excess heat that arises in this case must be dissipated through the semiconductor and the bonding layer.

However, interruptions in the solder lead to an increased thermal resistance and thus to a local overheating. Possible consequences range from thermal damage to the semiconductor or the contact to cracking or delamination on account of the different thermal expansion coefficients or local melting of the solder. For these reasons, the galvanic application of the carrier substrate without the need for a solder layer is particularly advantageous for nitride-based semiconductor components.

BRIEF DESCRIPTION OF THE DRAWINGS

In the drawings:

FIG. 1 shows a schematic sectional illustration of a first exemplary embodiment of a component according to the invention, FIGS. 2A and 2B respectively show a schematic sectional illustration of a component under thermal strains and a schematic sectional illustration of a flexed wafer, FIGS. 3A, 3B and 3C respectively show a schematic sectional illustration of a second exemplary embodiment of a component according to the invention under different operating conditions, FIGS. 7A to 7G show schematic sectional illustrations of some method steps of a first exemplary embodiment of a method according to the invention, FIGS. 9A to 9F show schematic sectional illustrations of some method steps of a second exemplary embodiment of a method according to the invention, FIGS. 11A to 11D show schematic sectional illustrations of some method steps of a fourth exemplary embodiment of a method according to the invention, FIGS. 12A and 12B respectively show a schematic sectional illustration of a mounting method of the fourth method-related exemplary embodiment.

DETAILED DESCRIPTION

Figure 3A:
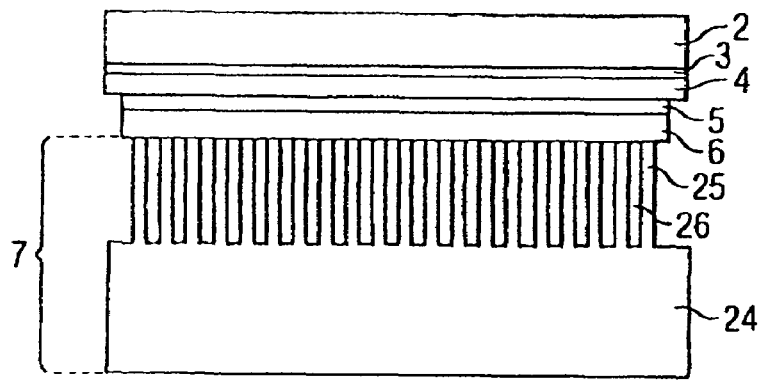

Identical or identically acting elements are provided with the same reference symbols in the figures. In particular the thickness of the layers is not illustrated to scale in the figures in order to afford a better understanding.

The semiconductor component illustrated in FIG. 1 has a semiconductor layer 2 arranged between a contact location 8 and a contact layer 3. The contact layer 3 may also be formed as an interrupted and/or patterned layer having a plurality of circular areas, by way of example. By way of example, the semiconductor layer 2 contains GaN and the contacts 3, 8 contain platinum, palladium or aluminum. The contact layer 3 (less than approximately 5 nm thick) lies on a reflection layer 4 (approximately 100 nm thick), which is very important for the light efficiency particularly in the case of optoelectronic applications. Depending on the light wavelength, the reflection layer 4 may comprise for example gold for the red spectral region or silver and aluminum for the blue. If the reflection layer can be impaired by alloying with other metals, then afterward a diffusion barrier 5 (for example made of TiW(N) and approximately 0.5 μm thick) is preferably applied on the reflection layer 4. In order to obtain better adhesion, the diffusion barrier 5 is coated with an adhesion and wetting layer 6 (for example comprising chromium and approximately 1 μm thick). The wetting layer 6 is adjoined by a carrier substrate 7, which is approximately 50 μm thick and is composed for example of metal, such as, inter alia, nickel, chromium, copper, tungsten. The thickness of the carrier substrate is governed by the desired mechanical stability of the component and the measures used, if appropriate, to compensate for the thermal expansions. A passivation layer 9 covers at least the semiconductor layer 2 in order to protect this from contaminants.

Unless specified otherwise, the above stipulations concerning materials and dimensions also apply to the further device-related and method-related exemplary embodiments.

In FIG. 2A, arrows are used to illustrate how, in the event of heating of a known component, the different expansion coefficients of the semiconductor 2 and of the carrier substrate 7 cause stresses in the component. Since the expansion coefficient of the semiconductor 2 is generally lower than that of the carrier substrate 7 (usually a metal), the carrier substrate 7 expands to a greater extent than the semiconductor in the event of heating. This may lead to flexure during processing and also during operation. Under certain circumstances, this flexure caused by thermal stresses may lead, as illustrated in FIG. 2A, to the occurrence of cracks in the semiconductor layer 2, which means the failure of the component. FIG. 2B shows the flexure 22 of the wafer 23, namely the maximum deviation of the wafer from the plane. In order to safeguard the semiconductor layer and to ensure processability, the flexure 22 should be limited to less than 100 μm. In the case of GaN epitaxial layers on an SiC substrate, huge cracks may already occur if the flexure 22 exceeds 100 μm in the case of a wafer (diameter 5 cm). Without particular measures for reducing the thermal stresses, temperature-dictated damage to the semiconductor 2 may already occur if the carrier substrate 7 is thicker than approximately 5 μm. Such problems certainly crop up if the carrier substrate 7 is thicker than 15 μm. Therefore, a carrier substrate 7 should not exceed 15 μm without some compensatory measures. Since this thickness is still too thin for the mechanical stability required during processing, one or more of the following measures according to the invention must be implemented.

The example embodied in FIG. 3A has a vertically patterned carrier substrate 7 comprising a carrier base 24, a plurality of vertical structure elements 25 and a plurality of interspaces 26. The following are arranged thereon in this order: a wetting layer 6, a diffusion barrier 5, a reflection layer 4, a contact layer 3 and a semiconductor layer 2. A second contact location is not represented here. In this example, the structure elements 25 have a circular cross section, but can also assume other forms. The height of the structure elements is preferably scaled with the lateral dimension of the semiconductor 2, so that the ratio of semiconductor width to the structure element height does not exceed the factor 15. The structure elements preferably have a high aspect ratio (i.e. height/width) of at least two in order that they can bend and compensate for thermal stresses more effectively. By way of example, the structure elements are 5-20 μm high and have a diameter of 5-10 μm. The thickness of the carrier base is preferably chosen to be at least as thick as the height of the structure elements and is generally between 20 μm and 100 μm. The thickness must impart sufficient mechanical stability to the component during processing and during operation. Moreover, the thickness is a question of time, material and ultimately costs. The interspaces 26 may remain filled with a photoresist used during the patterning, remain unfilled (i.e. empty), or, as in the following exemplary embodiment, be filled with a different material.

Figure 3B:
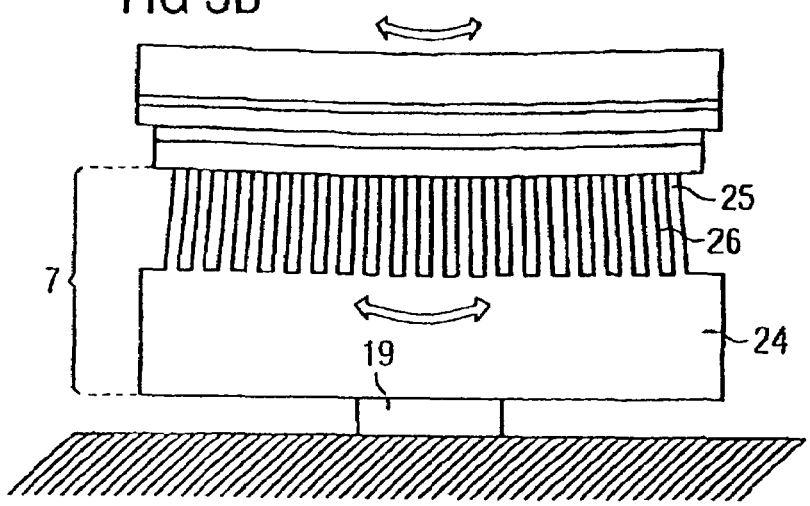

FIG. 3B shows the component embodied in FIG. 3A in the event of heating. The component is fixed by a very small part of the carrier substrate surface on a connecting conductor track 19. In the event of heating, the carrier substrate 7 expands more than the semiconductor, layer 2, the lower part of the structure elements 25 adapting to the expansion of the carrier base 24 and the upper part adapting to the expansion of the semiconductor layer 2. The structure elements compensate for this difference in expansion by bending, so that the structure elements bend inward in this example. The consequence of this is that the edges of the carrier base 24 and the edges of the semiconductor layer 2 bend upward slightly. This would also be the case if the component or the carrier substrate 7 were not fixed.

Figure 3C:
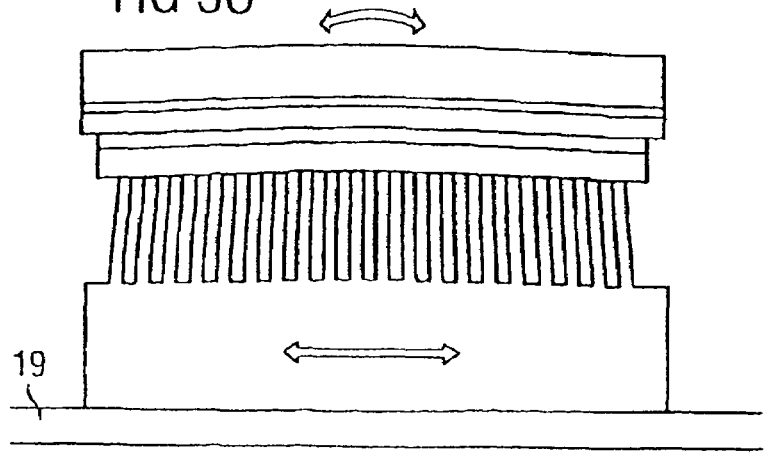

By contrast, as illustrated in FIG. 3C, the edges of the semiconductor layer 2 bend downward if the component is fixed areally on a circuit board or connecting conductor track 19. In this case, the upper part of the structure elements 25 also bends inward, as illustrated in FIG. 3B, but a small camber of the surface of the semiconductor layer 2 forms on account of the stiff, areally fixed carrier base 24.

Figure 4:
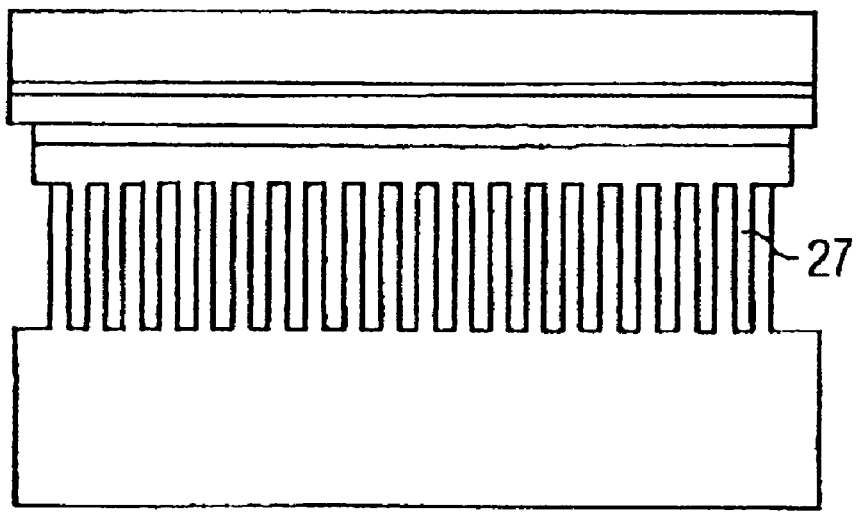
FIG. 4 shows a schematic sectional illustration of a third exemplary embodiment of a component according to the invention.

In a further exemplary embodiment, the interspaces 26 of the component illustrated in FIG. 3A are filled with a filling material 27 that is more elastic than the material of the carrier substrate 7, in order to improve the stability of the component. This is illustrated in FIG. 4. In this case, the structure elements 25 and carrier base 24 are composed for example of nickel and the filling material 27 is composed of gold. Other materials such as polymers are also conceivable as filling material 27.

Figure 5:
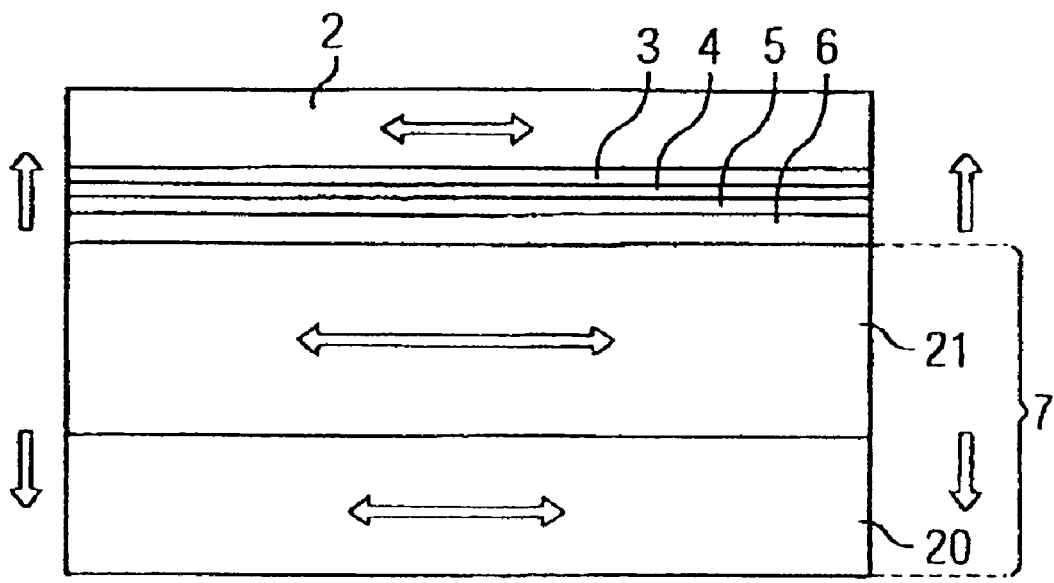
FIG. 5 shows a schematic sectional illustration of a fourth exemplary embodiment of a component according to the invention, FIGS. 6A and 6B respectively show a schematic sectional illustration of a fifth exemplary embodiment of a component according to the invention under different operating conditions.

FIG. 5 illustrates an exemplary embodiment which additionally affords a possibility for reducing the thermal bending stresses in a component of this type. The carrier substrate 7 of the example illustrated in FIG. 5 comprises two different materials with different expansion coefficients and moduli of elasticity. By way of example, the thinner carrier substrate layer 20 has a higher modulus of elasticity and smaller expansion coefficient than the thicker carrier substrate layer 21. The tension of the carrier substrate 7 at the semiconductor layer 2 is partly compensated for by means of the carrier substrate layer having a smaller expansion coefficient 20 and the thickness of the layers. By way of example, the upper carrier substrate layer 21 comprises copper with a thickness of 50 μm and the lower carrier substrate layer 20 comprises tungsten with a thickness of 1.3 μm or chromium with a thickness of 2.7 μm. More than two different materials may be provided as well. The second contact location 8 and a possible passivation layer 9 are not represented here.

Figure 6A:
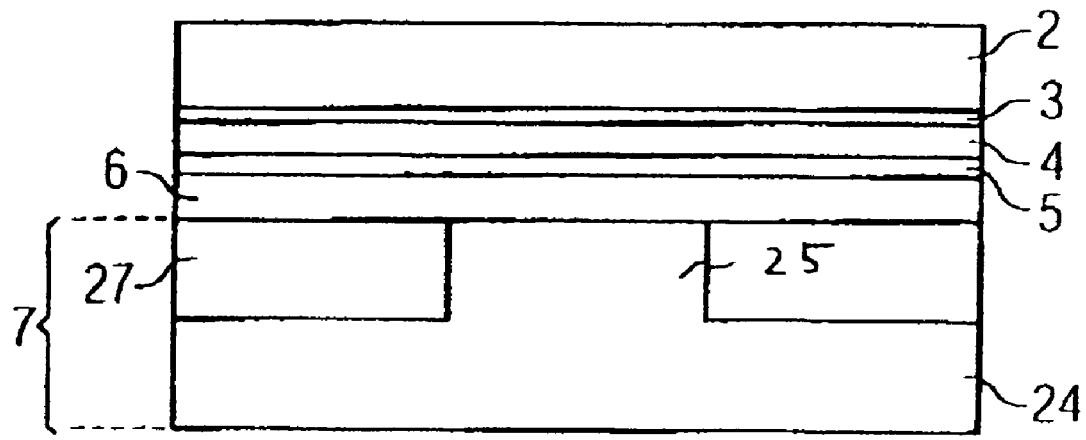

FIG. 6A illustrates a modification of the component shown in FIG. 4. The carrier substrate 7 in this case has a single vertical structure element 25 arranged centrally below the semiconductor layer 2, i.e. in centred fashion with respect to the semiconductor layer 2. This structure element 25 thereby forms a stable core for the component and is limited in size such that thermal strains still do not lead to failures. By way of example, this structure element 25 is circular in cross section and has a diameter of approximately 100 µm if the component has a diameter of approximately 300 µm. Other forms and sizes of the structure element 25 are also conceivable. The remaining external space is filled with a softer material that can take up the thermal strains. As described above with respect to FIG. 4, for example nickel is suitable for the structure element 25 and carrier base 24 and gold is suitable for the filling material 27. However, the filling material 27 should still be able to dissipate the heat from the component.

Figure 6B:
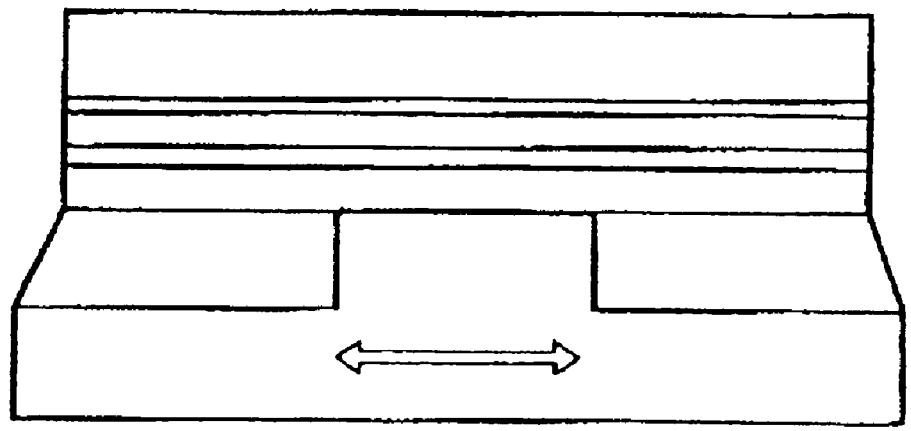

FIG. 6B shows the component illustrated in FIG. 6A under thermal strains. In this case, the semiconductor layer is loaded to a much lesser extent than the component illustrated in FIG. 1 because a smaller interface between the more greatly expanded carrier substrate and the semiconductor layer is loaded and, therefore, only a fraction of the strains experienced by the component illustrated in FIG. 1 can have a harmful effect on the semiconductor layer 2. The filling material 27 adapts both to the expansion of the carrier substrate 7 and to the expansion of the semiconductor layer 2.

FIGS. 7A to 7G show the schematic sequence of the method for producing the component according to the invention as illustrated in FIG. 1. The desired semiconductor layer 2 is deposited epitaxially on a growth substrate 1 (see FIG. 7A). In this example, GaN is deposited epitaxially on sapphire.

Figure 7A:
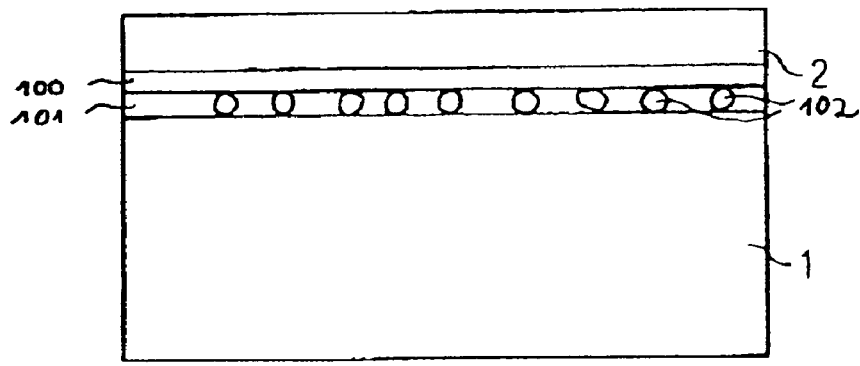
Figure 7B:
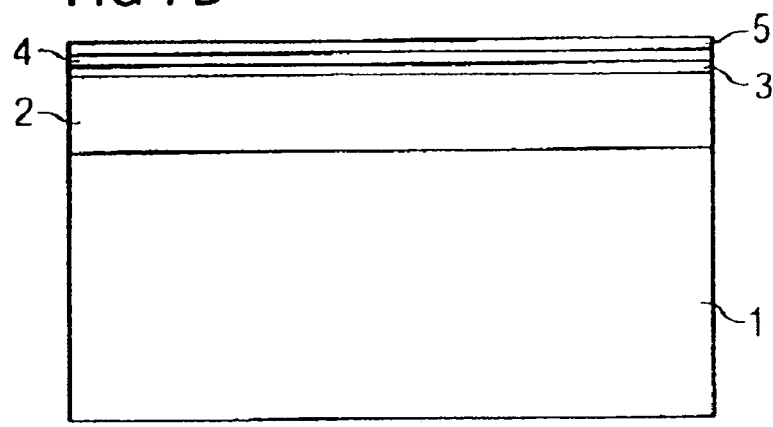

As illustrated in FIG. 7B, the semiconductor layer 2 is then provided with a contact layer 3 preferably by means of vapor deposition or sputtering. Since the layers that are applied later are not light-transmissive, this layer should have good reflectiveness in the case of optoelectronic devices. However, the contact of the mirror metallization with respect to the semiconductor layer 3 is often poor. Therefore, an additional reflection layer 4 may be applied to the contact layer 3, the contact layer 3 being formed by layers that are very thin and semitransparent or are provided with holes and are made of contact metals exhibiting better electrical conduction, so that it absorbs little light. If the mirror can be destroyed by alloying with other metals, a diffusion barrier 5 should subsequently be applied to the reflection layer 4. The application of the reflection layer 4 and/or diffusion barrier 5 may be effected by means of vapor deposition or sputtering.

As the topmost layer, an adhesion and wetting layer 6 is applied to the diffusion barrier 5. This is preferably applied by means of vapor deposition or sputtering and may comprise chromium, nickel or conductive TiO. (See FIG. 7C).

A carrier substrate 7 is deposited on the adhesion and wetting layer 6 up to the desired thickness for example by means of sputtering, a CVD method (namely a chemical vapor deposition method), a galvanic method, electroless plating or some other known method. See FIG. 7D. The thickness of the carrier substrate essentially depends on the mechanical stability required during processing and during operation, the maximum permitted thermal stresses before cracks occur in the semiconductor, and on whether measures such as the incorporation of an auxiliary substrate (as explained below) have been implemented. In the absence of measures for compensating for thermal stresses, the thickness of the carrier substrate should not exceed 15 µm. Since this thickness is too thin for processing, an auxiliary substrate 12 may be used. (See FIG. 8 and the description with respect thereto below).

The carrier substrate 7 should comprise a material that has good thermal and electrical conductivity and is also mechanically stable. Unevennesses and impurity particles should also be compensated for by the carrier substrate 7. Since the deposition can be effected at room temperature, an interdiffusion during the process need not be feared. A galvanic method is preferably used. Vapor deposition has the disadvantages that the deposit rates are relatively low and the applied layer has low strength. By contrast, sputtering methods, deposition from the gas phase (CVD method) and deposition from a liquid phase are better suited.

Figure 8:
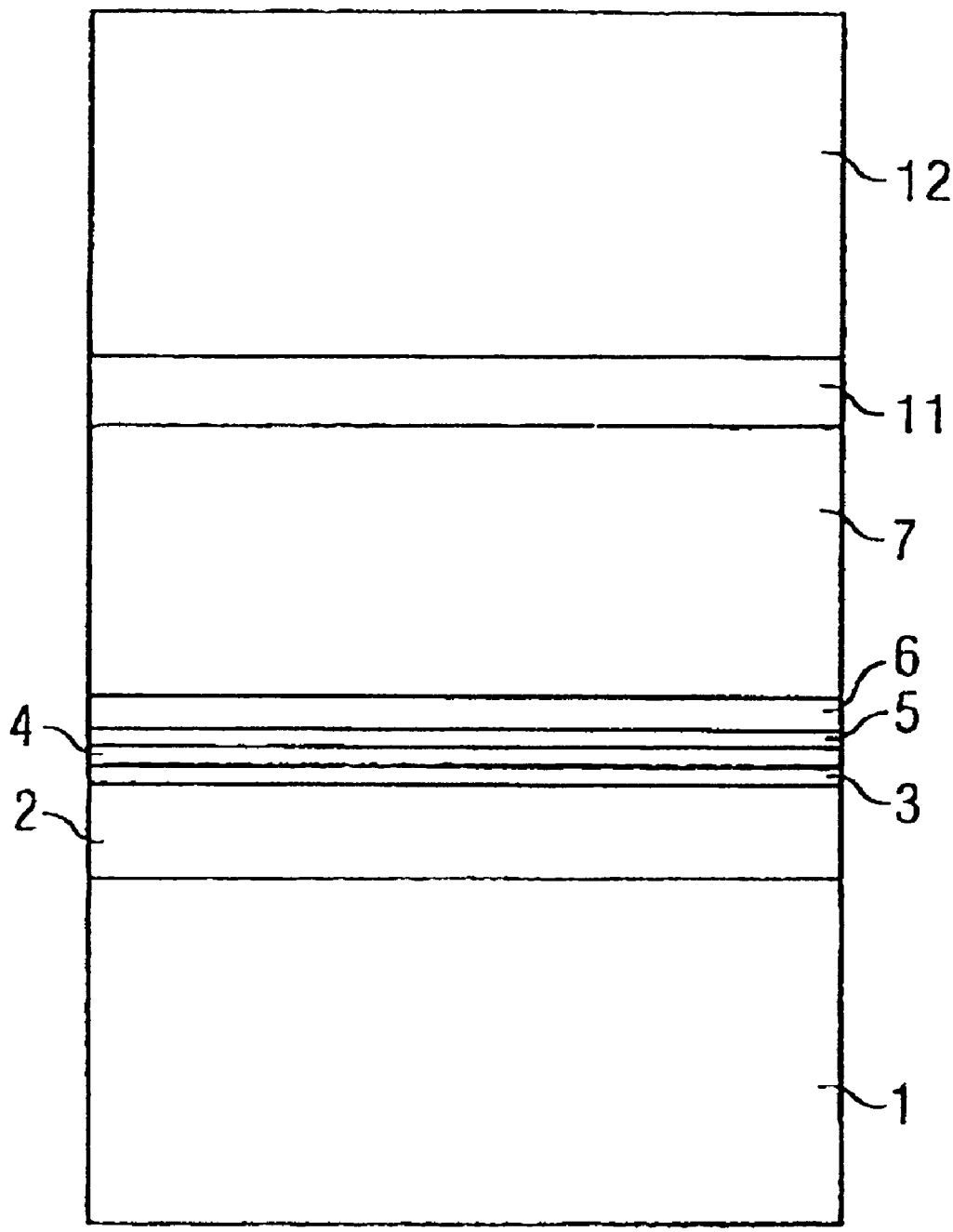
FIG. 8 shows a schematic sectional illustration of a sixth exemplary embodiment of a component according to the invention.

As shown in FIG. 8, a solder layer 11 may optionally be additionally applied to the carrier substrate 7 in order to bond a further auxiliary substrate 12 on it. By way of example, it is possible to use a mechanically stable semiconductor such as silicon, germanium, silicon carbide or a metal substrate made of molybdenum or tungsten. The solder layer 11 has a gold/tin mixture, by way of example. An auxiliary substrate 12 may be necessary if the metal layer itself is not to be too thick, or the deposition thereof is very expensive. Since the solder layer 11 is now situated at a greater distance from the semiconductor layer 2, its poor mechanical properties, as already explained above, do not influence the separation process. The solder layer 11 and/or the auxiliary substrate 12 may be applied by means of sputtering, vapor deposition or galvanically. After the removal of the growth substrate 1, it is possible, given the choice of a solder having a low melting point, for the auxiliary substrate 12 to be removed again and returned to the process or exchanged for a different one (e.g. a less expensive one made of aluminum or copper). Moreover, the auxiliary substrate 12 may also be fixed by means of an adhesive-bonding method (e.g. NanoPierce®, see http://www.nanopierce.com).

After the application of the carrier substrate and possibly of the auxiliary substrate, the growth substrate 1 is separated from the semiconductor layer 2. Depending on the growth substrate 1 and semiconductor 2 selected, this process step may be carried out by means of chemical dissolution of the growth substrate 1, a sacrificial layer, a laser lift-off method, a laminated growth substrate furnished with desired breaking locations, or some other known method.

Substrate materials such as GaAs or silicon can readily be chemically dissolved. The growth substrate is lost in the process. In addition, the semiconductor must either itself be inert toward the etching solution or be equipped with special etching stop layers. A further possibility is to incorporate a sacrificial layer 100 (see FIG. 7A) into the semiconductor layer 2 which can be etched selectively. In this way, the growth substrate 1 is not lost and can also be reintroduced in the process.

In the material system of nitrides that are used for generating light in the short-wave spectral range, no suitable chemical etching methods have been disclosed heretofore both for customary substrates such as sapphire or silicon carbide and also semiconductors (such as AlN, GaN, InN). Therefore, the laser lift-off method, for example, is used here for separating the semiconductor layer 2. This exploits the fact that GaN can decompose into gallium and gaseous nitrogen in the event of bombardment using a laser. A laser is used which has a photon energy sufficient for the decomposition of the GaN, but not sufficient for the decomposition of the growth substrate. The laser sends radiation through the sapphire, which is still transparent at the required wavelengths. At the boundary layer with respect to the sapphire, the GaN is thus decomposed and the semiconductor layer 2 is separated from the sapphire growth substrate 1 on account of the production of the gases and the pressure. The component after the separation of the growth substrate 1 is represented in FIG. 7E. However, this method is not possible in the case of GaN deposited on SiC, since SiC has a smaller band gap than GaN and is therefore decomposed before GaN.

Furthermore, it is also possible to deposit the semiconductor layer 2 on an already laminated growth substrate 1. As shown in FIG. 7A, a laminated growth substrate 1 (e.g. SMARTCUT® or UNIBOND®) has, as the topmost layer, an adhesion layer 101 furnished with suitable desired breaking locations 102. At said locations, the thin semiconductor layer 2 is separated from the growth substrate 1 after the application of the carrier substrate 7.

Mesa trenches 10 are then etched at least into the semiconductor layer 2 and the contact layer 3 in such a way that individual chips are defined between the mesa trenches 10. The mesa trenches 10 extend at least through the entire semiconductor layer 2 and the contact layer 3. The form of the mesa trenches 10 in cross section is represented in FIG. 7F, for example. Other forms are also possible. The etching of mesa trenches 10 may be carried out by means of photolithography or other known methods in combination with dry etching, for example the RIE method (i.e. reactive ion etching).

In a further method step, in accordance with FIG. 7F, the contact 8 is applied to the semiconductor layer 2 by means of sputtering or vapor deposition. The contact 8 contains aluminum, by way of example. A passivation layer 9 (e.g. made of silicon nitride or silicon oxide) may possibly be applied by means of sputtering or a CVD method over that part of the semiconductor layer 2 which is not covered by the contact 8, and at least over the side areas of the contact layer 3.

Three-dimensional structures may optionally be produced in the semiconductor or in the passivation layer 9 for the purpose of optimizing the coupling-out of light. Since the light is first coupled out from the semiconductor, such structures have a better effect if they are produced in the semiconductor layer 2 compared with in the passivation layer 9. However, structures for improving the coupling of light may, of course, be produced in both layers.

By way of example, pyramid structures having at least three visible areas per pyramid are etched into the semiconductor layer 2 before the contacts 8 or the possible passivation layer 9 are applied. Once the semiconductor layer 2 has been separated from the growth substrate 1, the surface of the semiconductor layer 2 is somewhat rough. The pyramid structures are produced in particular by means of an anisotropic etching method such as an RIE method. Depending on the semiconductor selected, however, the structures may also be produced by means of wet-chemical etching or dry etching methods. For example, an RIE or ICP method (i.e. inductively coupled plasma) is better suited to patterning the GaN, it also being possible to use wet-chemical etching for a GaAs semiconductor. After such patterning, the contact 8 and preferably also a passivation layer 9 are applied in order to protect the surface from soiling.

Finally, the chips are singulated along the mesa trenches 10 for example by means of sawing or laser cutting. FIG. 7G illustrates the singulation using a saw blade.

The method steps of a modification of the method illustrated in FIGS. 7A to 7G are portrayed in part in FIGS. 9A to 9F. The details concerning materials and methods from the above exemplary embodiment also apply to the exemplary embodiments below, unless specified otherwise. The application of the semiconductor layer 2, contact layer 3 and reflection layer 4 on the growth substrate 1 is carried out according to the above description with respect to FIGS. 7A and 7B. In this case, the reflection layer 4 is integrated in the contact layer 3. This combined layer is identified by the designation 3+4 in the figures.

Figure 9A:
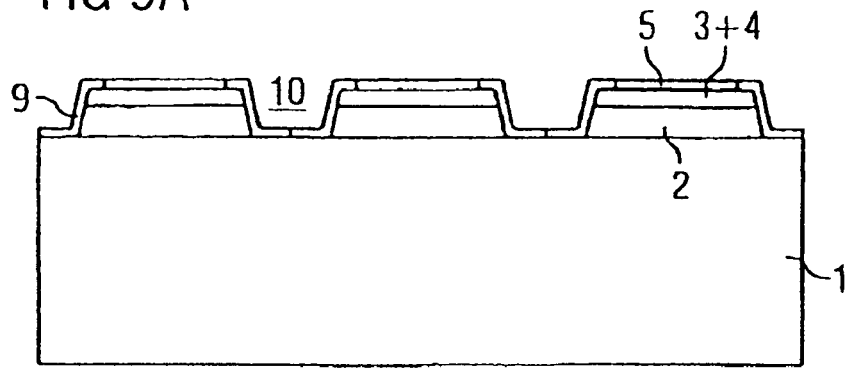

As represented in FIG. 9A, in this case the mesa trenches 10 are etched into the contact/reflection layer 3+4 and semiconductor layer 2 before the semiconductor layer 2 is separated from the growth substrate 1. This may be advantageous if the mesa etching process causes problems with an underlying layer. For example, the diffusion barrier 5, the wetting layer or the carrier substrate 7 are applied before the mesa etching process in the case of the method above, but in the case of this method are not applied until after the mesa etching process and are therefore not exposed to the etching. After the etching, the layer stack (namely the contact/reflection layer 3+4 and semiconductor layer 2) is situated in the form of individual islands on the growth substrate 1. A diffusion barrier 5 is applied on these islands, i.e. to the contact/reflection layer 3+4. Afterward, a passivation layer 9 is applied areally over the contact/reflection layer 3+4 and semiconductor layer 2 not covered by the diffusion barrier, and over that part of the growth substrate 1 which is situated in mesa trenches 10.

An adhesion and wetting layer 6 is applied to the entire surface including the surface of the mesa trenches 10. See FIG. 9B.

Figure 9B:
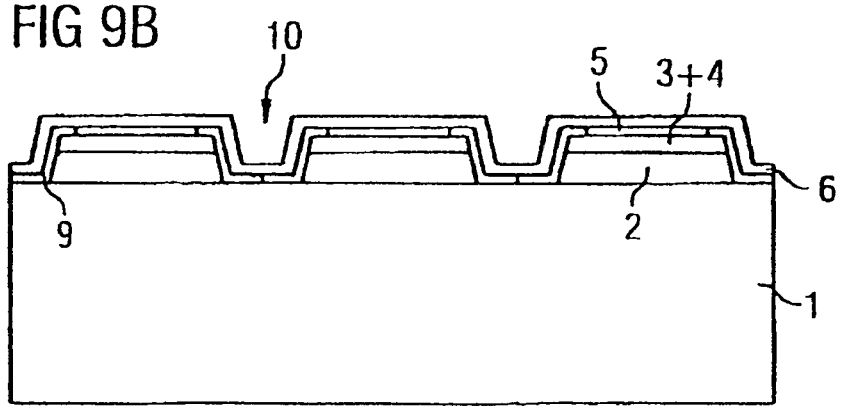
Figure 9C:
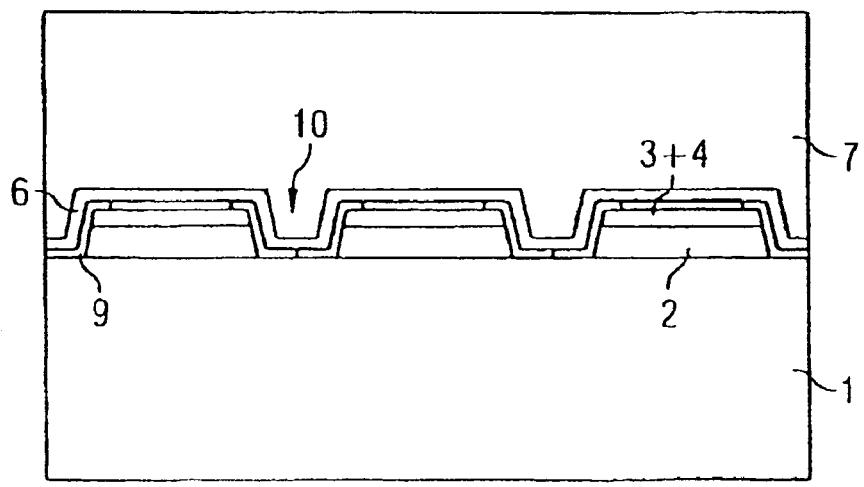

In accordance with FIG. 9C, the carrier substrate 7 is applied to the wetting layer 6 galvanically, for example, up to the desired thickness, so that the mesa trenches 10 are also filled.

The growth substrate 1 is separated from the semiconductor layer 2 according to one of the separation methods mentioned above. In this case, the parts of the passivation layer 9 which lie in the mesa trenches are also removed. See FIG. 9D.

In accordance with FIG. 9E, the contacts 8 are applied to the semiconductor layer 2. In order that the semiconductor layer 2 is better protected from contaminants, the passivation layer 9 is extended onto the semiconductor layer 2.

Finally, the chips are singulated along the mesa trenches by means of sawing or laser cutting. See FIG. 9F.

A further method-related exemplary embodiment is illustrated in FIGS. 10A to 10G. This method directly follows the previous method after the application of the wetting layer 6 (cf. FIGS. 9B and 10A). Instead of applying the carrier substrate 7 areally as illustrated in FIG. 9C, separating ridges 13 made of a photoresist, for example, are applied by means of photolithography, the LIGA method or a similar method with galvanic molding. This is achieved by applying the photoresist areally to the wetting layer 6 up to a thickness of at least 10 μm, with the result that all the mesa trenches are also completely filled over their entire length. After suitable exposure, the photoresist situated between the mesa trenches and above the semiconductor layer 2 can be selectively removed (see FIG. 10B). It is important that this material can be selectively removed. The separating ridges 13 can achieve very high aspect ratios with modern resist systems (e.g. a LIGA method or a photoresist suitable therefor such as ma-P 100 or SU-8 from Microchem Corp.). Separating ridges that are as narrow as possible are advantageous. The narrower the separating ridges 13, the less useable wafer area is wasted by the separating ridges. This in turn means that the number of chips per wafer is increased and the costs are reduced.

Figure 10A:
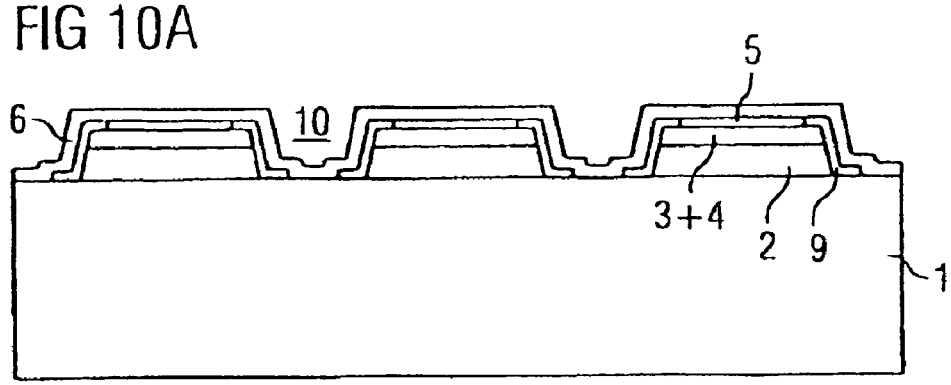
FIGS. 10A to 10G show schematic sectional illustrations of some method steps of a third exemplary embodiment of a method according to the invention.
Figure 10B:
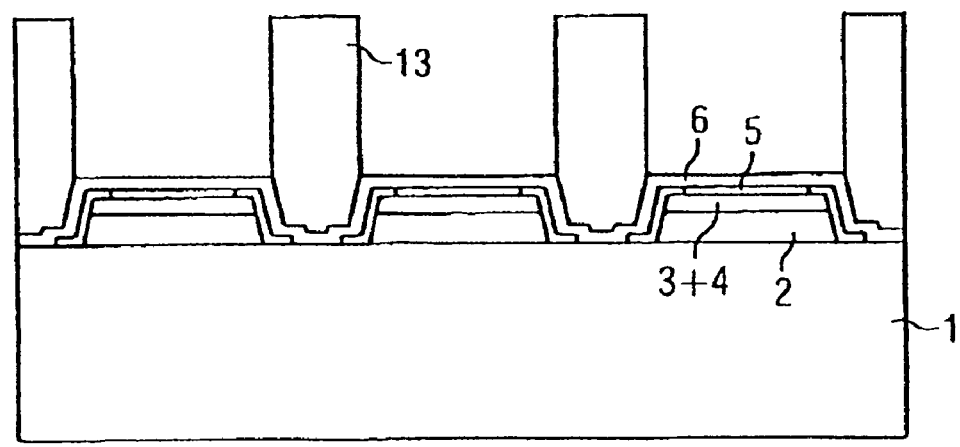
Figure 10C:
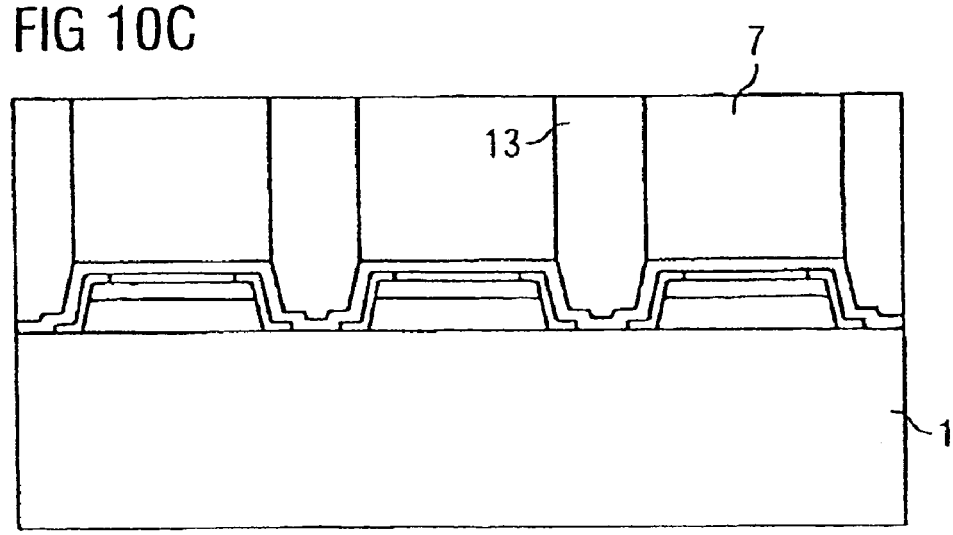
Figure 10D:
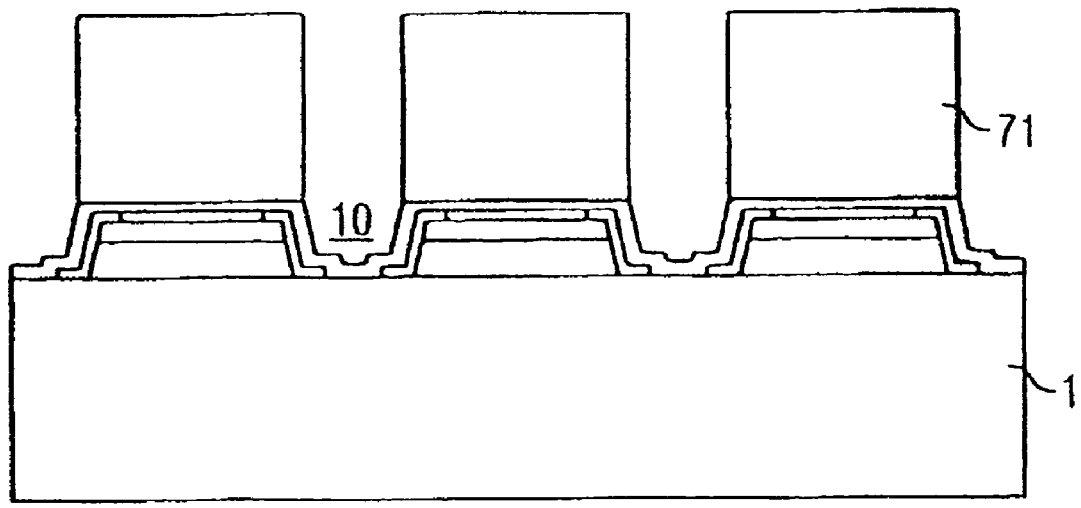
Figure 10E:
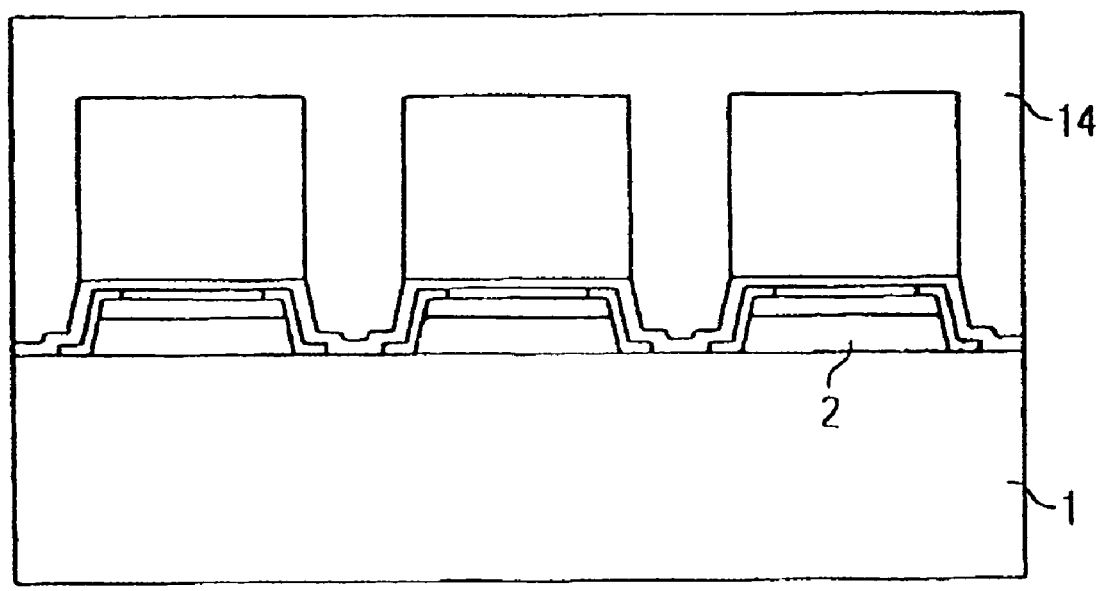

The interspaces between the separating ridges 13 above the semiconductor layer 2 are filled according to FIG. 10C galvanically, for example, with a material suitable as carrier substrate 7 at most up to the height of the separating ridges. The separating ridges are then removed selectively with the aid of a solvent or by etching. The carrier substrate islands 71 produced as a result of this are represented in FIG. 10D. For simpler handling for further processing, the carrier substrate islands 71 together with mesa trenches are completely overformed with an auxiliary material 14 of load-bearing thickness. The components after this overforming are represented in FIG. 10E. The auxiliary material 14 may be applied by means of a sputtering method, a CVD method, a galvanic method, electroless plating or some other known method. The use of metals, suitable polymers, (e.g. polyimide) or spin-on glasses is conceivable. Mechanical strength can also be imparted by adhesive bonding or soldering onto a second substrate. What is important, however, is that the auxiliary material 14 can be selectively removed again.

Figure 10F:
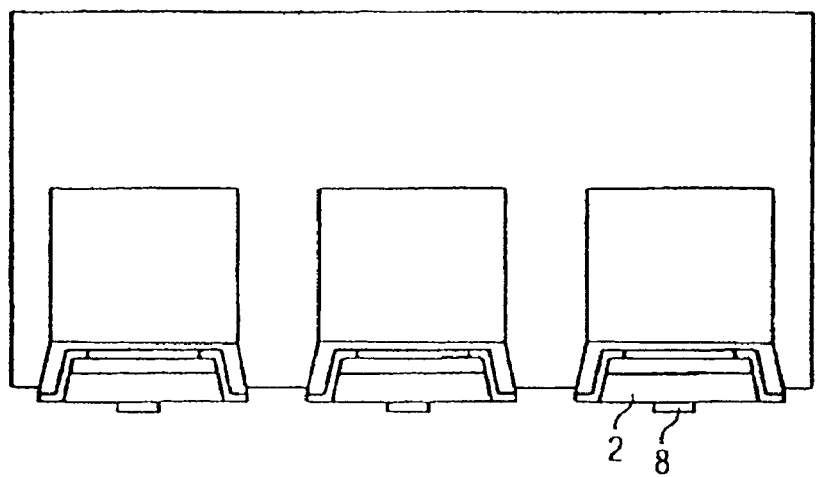

After overforming with auxiliary material 14, the growth substrate 1 is separated from the semiconductor layer 2 according to one of the methods already mentioned. As shown in FIG. 10F, the contacts 8 are subsequently applied to the semiconductor layer 2.

Figure 10G:
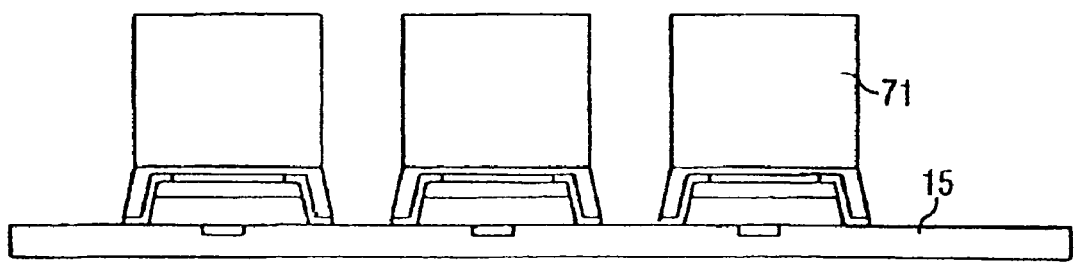

The components can then be singulated without mechanical force. A carrier film 15 is applied over the contacts 8 on the semiconductor layer and the auxiliary material 14 is selectively removed by etching, by way of example. The components are then automatically singulated and, as represented in FIG. 10G, are available on a carrier film 15. This singulation process can be very fast, assuming sufficient etching rates. Unlike sawing, for which the time spent is simply proportional to the number of components, the time spent in this case is independent of the number of components and the wafer size. This has the additional advantage over the sawing process that any geometry restrictions on the component are obviated. It is thus possible also to produce round or quadrangular components. The narrow separating ridges 13 also reduce the waste of wafer area that is omitted in an unused manner as a sawing track.

Figure 11A:
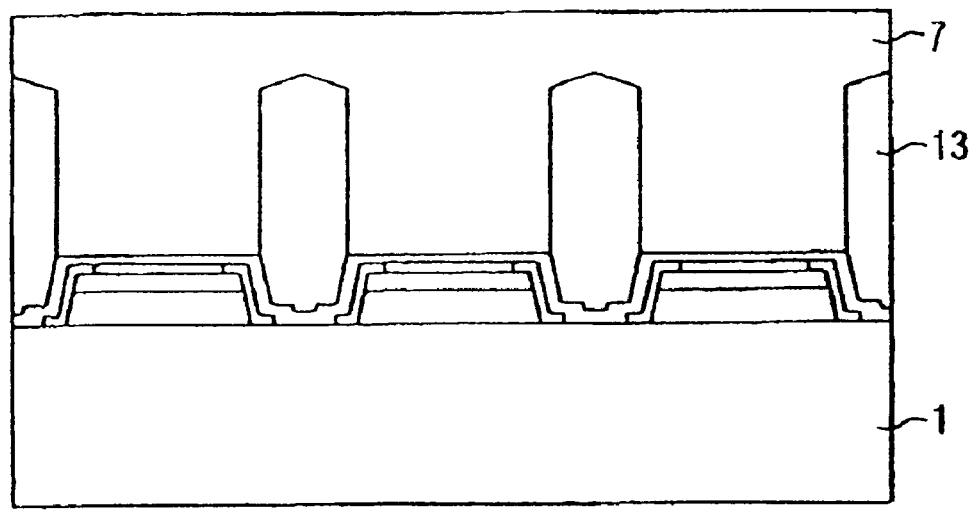
Figure 11B:
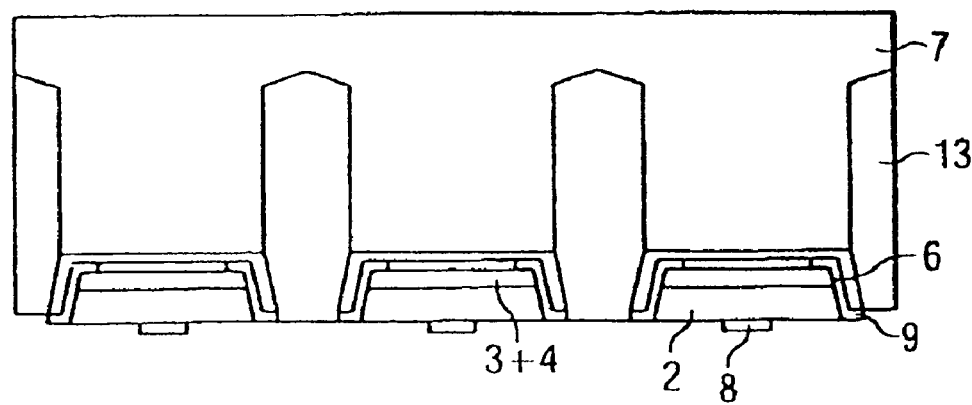

FIGS. 11A to 11D portray a further exemplary embodiment, which constitutes a variation of the last method. In the case of this exemplary embodiment, the method essentially proceeds according to the scheme summarized in FIGS. 10A to 10C with the exception that the top side of the separating ridges 13 is formed as a tip in cross section. Instead of applying the carrier substrate 7 only up to the height of the separating ridges 13, this process is continued, with the result that the entire structure together with separating ridges 13 is areally overformed. This is illustrated in FIG. 11A and can be effected using the same material as the material used for the carrier substrate 7, or using a different material.

The overformed structure should then have a load-bearing capability sufficient to enable the growth substrate 1 to be readily removed. The contacts 8 are applied to the semiconductor layer 2. See FIG. 11B.

FIG. 11C shows the components after the separating ridges 13 have been dissolved from the side of the semiconductor layer 2 by means of an organic solvent, by way of example. Each chip is thus situated as it were freely on carrier substrate islands connected by a carrier substrate layer. Since the connecting carrier substrate layer is now comparatively thin, the components, as shown in FIG. 11D, can be sheared off with little force. The pointed form of the separating ridges supports the shear process and may also have an advantageous effect in the case of a carrier substrate material having a low shear strength.

Figure 12A:
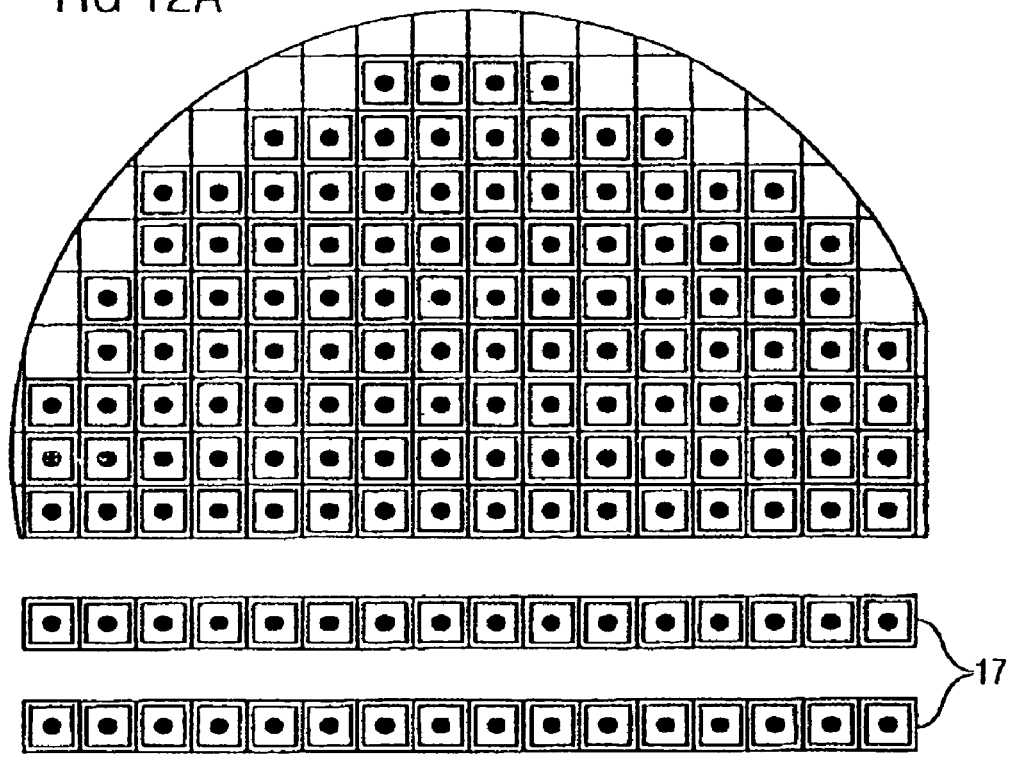
Figure 12B:
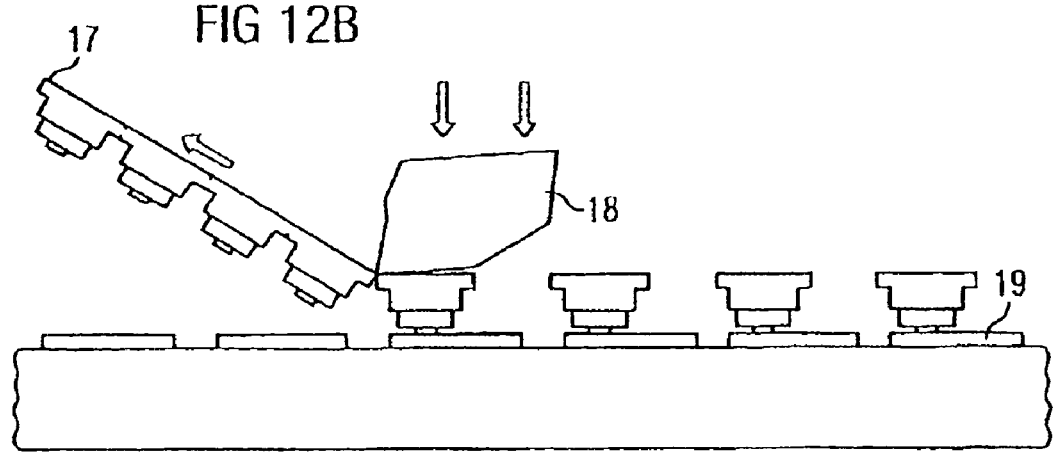

FIGS. 12A and 12B show the subdivision of an entire wafer with components in rows and how the rows can be fixed e.g. by means of thermocompression on connecting conductor tracks 19. At the same time, a mounting machine 18 tears or breaks up the connection and moves to the next array. Since only short distances are covered in this case, the method is also suitable for populating areas with relatively large numbers (e.g. of self-luminous RGB displays).

Figure 13A:
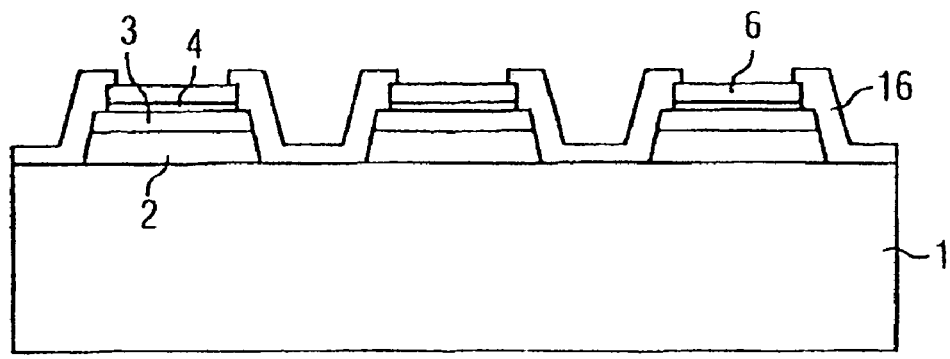
FIGS. 13A to 13B show schematic sectional illustrations of some method steps of a fifth exemplary embodiment of a method according to the invention.
Figure 13B:
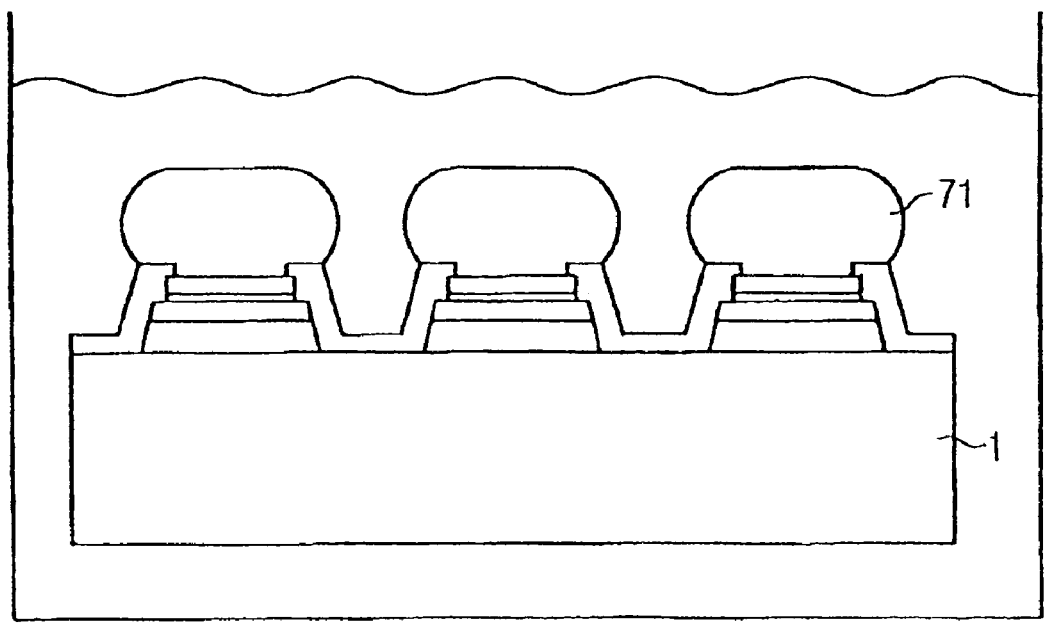

FIGS. 13A and 13B portray a further exemplary embodiment, which constitutes an alternative to the method shown in FIGS. 10A to 10G. In this case, the component is produced without photoresist and without patterning. Instead of the wetting layer 6 being applied to the entire surface as in FIG. 10A, in the case of this exemplary embodiment the wetting layer 6 is applied only to the outermost layer above the semiconductor layer 2, i.e., no wetting material is situated on the side areas or surfaces of the mesa trenches. As illustrated in FIG. 13A, an anti-wetting layer 16 is applied to the side areas and surfaces of the mesa trenches. Said anti-wetting layer 16 may be a dielectric such as silicon nitride or silicon oxide. The wetting layer 6 comprises gold or titanium, by way of example.

By way of example, the carrier substrate material (e.g. nickel) grows only on the wetting layer 6 during electroless deposition. If the process is stopped before the mesa trenches are grown over, separate carrier substrate islands 71 as represented in FIG. 13B are obtained. These components can then be processed further like the components represented in FIG. 10D. Although the structure fidelity of the carrier substrate islands 71 is not as good as in the photoresist method (namely the method illustrated in FIGS. 10A to 10G), in return the costs for resist processing and exposure are saved, however.

The components according to the invention as represented in FIGS. 3A, 4 and 6A can be produced with suitable modifications also according to the methods according to the invention, namely according to modifications of the methods illustrated in FIGS. 7, 9, 10, 11 and 13.

For the production of the components represented in FIGS. 3A, 4 and 6A, it is necessary to pattern the carrier substrate 7 or the carrier substrate islands 71. This patterning may be achieved for example by means of photolithography, a LIGA method or some other known method. With the aid of photolithography as an example, prior to the application of the carrier substrate 7, a suitable photoresist should be applied to the wetting layer 6, correspondingly exposed and etched, thereby obtaining the negative form of the vertical structure elements or the structure element 25 of the desired component. In order to achieve structure elements 25 having high aspect ratios, use is preferably made of a LIGA method or a photoresist suitable therefor (e.g. ma-P 100 or SU-8 from Microchem Corp.).

In order to produce the component represented in FIG. 4 or 6A, the photoresist, if it is sufficiently elastic, can be left in the component e.g. according to the LIGA method, or it is possible to fill the interspaces 26 with an additional filling material 27. The last alternative should be carried out after the dissolution of the photoresist. This may be effected by means of an injection method in which, by way of example, a thermoplastic is injected into the interspaces, by the flowing in of a filling material 27 in the liquid phase, e.g. at high temperatures, by the flowing in of an adhesive in the liquid phase, which subsequently dries or cures (such as epoxy resin), or by means of some other known method.

Figure 7C:
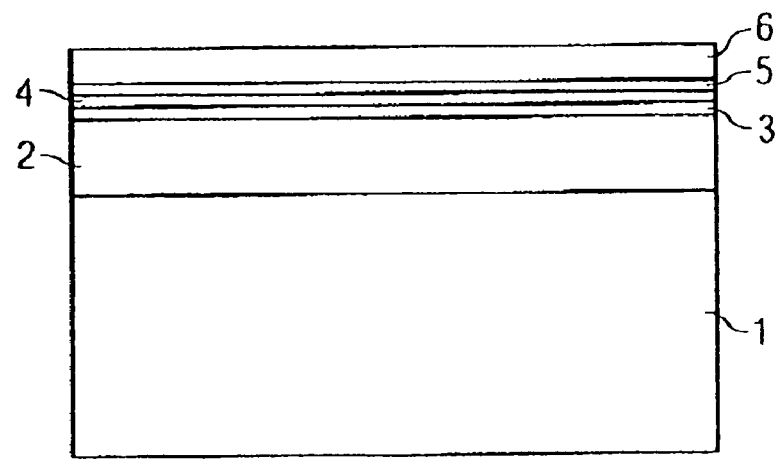
Figure 7D:
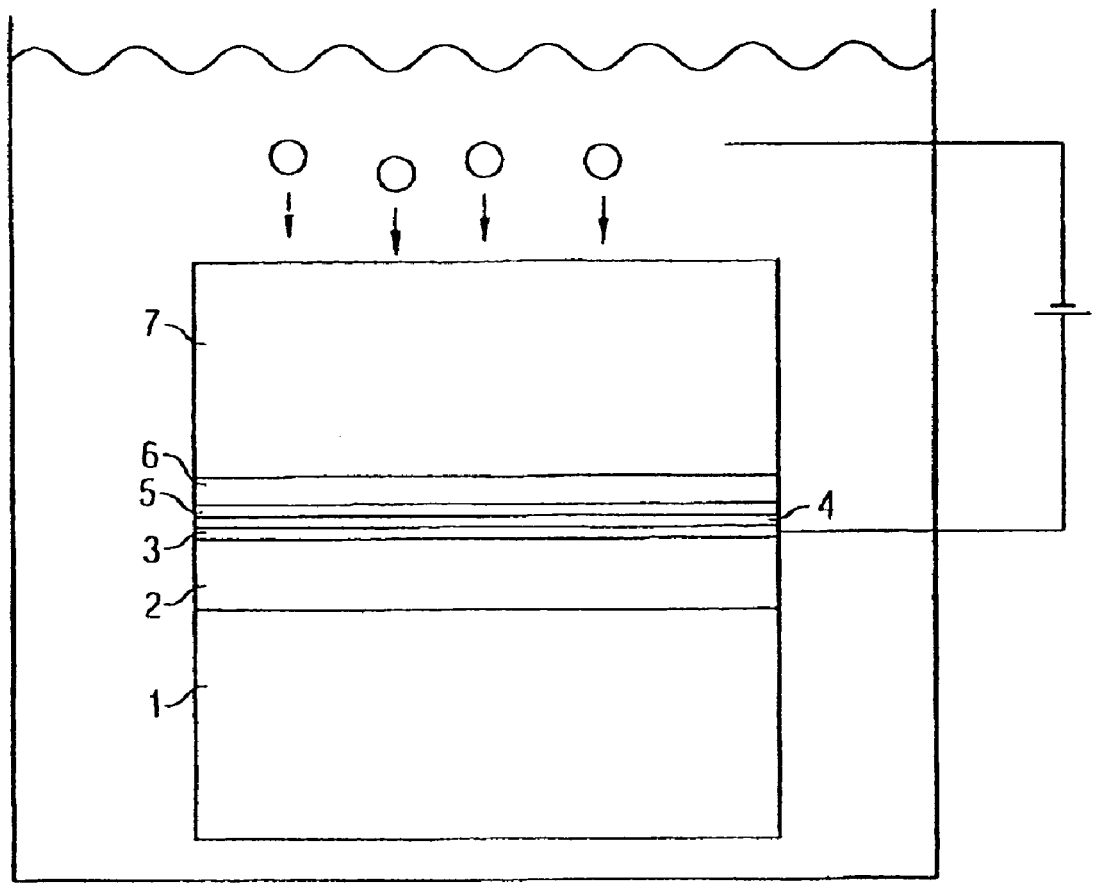
Figure 7E:
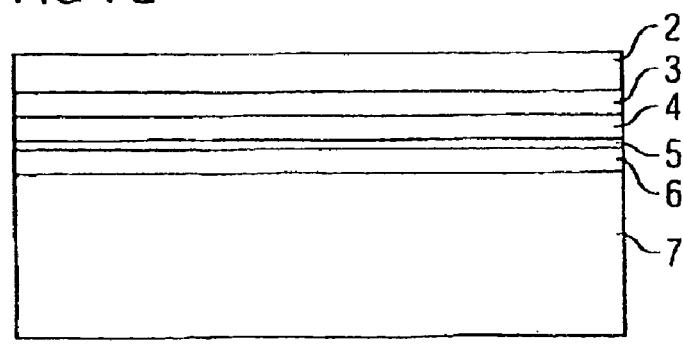

In the context of the method illustrated in FIGS. 7A to 7G, the branching-off in order to produce a component illustrated in FIGS. 3A, 4 or 6A occurs after the production stage represented in FIG. 7C is reached. As already described above, the photoresist is in this case applied to the wetting layer 6 and patterned with a plurality of negative forms of structure elements 25 if the component represented in FIG. 3A or 4 is sought. Alternatively, the photoresist is patterned with a negative form of the structure element 25 if the component represented in FIG. 6A is to be achieved. Afterward, the carrier substrate 7 is deposited according to one of the abovementioned methods, although beyond the photoresist up to the desired thickness of the carrier base 24 (e.g. 50 μm). The carrier substrate is thus formed in one piece, by way of example. The photoresist may or may not be dissolved at any time prior to the singulation of the components. If the photoresist is more elastic or softer than the material of the carrier substrate 7, then the photoresist may simultaneously serve as filling material 27 for the component represented in FIG. 4 or 6A. Otherwise, the component may be processed further as already described with respect to FIGS. 7E to 7G.

The carrier substrate 7 may also be patterned after reaching the process stage shown in FIG. 9B. As already described above, the photoresist is applied to the wetting layer 6 and patterned and the carrier substrate 7 is applied in such a way that at least one structure element and an interspace are formed and a carrier base 24 is formed. After the optional dissolution of the photoresist and the optional application of a filling material 27, the further processing may be effected according to FIGS. 9D to 9F.

The patterning may similarly take place after the production stage reached in FIG. 10B. In this case, the photoresist is applied to the wetting layer 6 situated between the separating ridges 13 and is patterned. As already described above, the carrier substrate 7 is applied to the wetting layer 6, or to the photoresist, situated between the separating ridges, with the result that a carrier base 24 is also formed. The further processing in accordance with FIGS. 10D to 10G may be effected with or without dissolution of the photoresist or the application of a filling material 27.

As already described above, the carrier substrate may be patterned according to the method represented in FIGS. 11A to 11D. The structure elements 25 are lower than the separating ridges 13 in order that sufficient mechanical stability can be imparted to the component during a possible shear method. By way of example, the structure elements 25 are approximately 15 μm high and the separating ridges 13 are approximately 50 μm high. The separating ridges 13 may generally have a height of between 50 μm and 200 μm, but the higher the separating ridges 13, the thicker the carrier substrate 7 becomes and the more material is required, which is in turn a question of costs.

In accordance with the method illustrated in FIGS. 13A and 13B, it is possible to produce a patterned carrier substrate 7, for production of a component illustrated in FIGS. 3A, 4 or 6A, above the wetting layer 6 represented in FIG. 13A.

The scope of protection of the invention is not restricted by the description of the invention on the basis of the exemplary embodiments. Rather, the invention encompasses any new feature and also any combination of features, which in particular comprises any combination of features in the patent claims, even if this combination is not specified explicitly in the patent claims.

What is claimed is:

1. A semiconductor component comprising:
    a one-piece carrier substrate comprising at least one vertical structure element, at least one interspace, and a carrier base;
    a light-emitting semiconductor layer or a light-emitting semiconductor element formed over the carrier substrate; and
    two contact locations formed over the carrier substrate,
    wherein the carrier base is spatially separate from the semiconductor layer by the at least one interspace and by the at least one vertical structure element.

2. The semiconductor component as claimed in claim 1, in which the at least one vertical structure element is situated centrally below the semiconductor layer.

3. The semiconductor component as claimed in claim 1, in which the at least one vertical structure element is circular or rectangular in cross section.

4. The semiconductor component as claimed in claim 1, in which the at least one vertical structure element has an aspect ratio of at least two.

5. The semiconductor component as claimed in claim 1, in which the ratio of a semiconductor layer length to a vertical structure element height does not exceed 15.

6. The semiconductor component as claimed in claim 1, in which the at least one interspace is filled with a filling material that is more elastic than a material of the carrier substrate.

7. The semiconductor component as claimed in claim 1, in which at least one wetting layer is formed between the carrier substrate and one of the two contact locations situated nearer to the carrier substrate.

8. The semiconductor component as claimed in claim 7, in which at least one reflection layer is arranged between one of the two contact locations situated nearer to the carrier substrate and the at least one wetting layer.

9. The semiconductor component as claimed in claim 1, in which at least one reflection layer is arranged between the carrier substrate and one of the two contact locations situated nearer to the carrier substrate.

10. The semiconductor component as claimed in claim 9, in which at least one diffusion barrier is arranged between the reflection layer and the carrier substrate.

11. The semiconductor component as claimed in claim 1, in which the carrier substrate is electrically conductive.

12. The semiconductor component as claimed in claim 1, in which the carrier substrate comprises a plurality of vertical structure elements separated from one another by interspaces.

13. The semiconductor component as claimed in claim 12, in which the interspaces are filled with a filling material that is more elastic than a material of the carrier substrate.

14. The semiconductor component as claimed in claim 1, in which at least one wetting layer, at least one reflection layer, and at least one diffusion barrier are arranged between the carrier substrate and one of the two contact locations situated nearer to the carrier substrate,
    wherein the least one diffusion barrier is arranged between the at least one reflection layer and the at least one wetting layer.

15. The semiconductor component as claimed in claim 1, in which the vertical structure element is a single vertical structure element arranged in a central fashion with respect to the light-emitting semiconductor layer or the light-emitting semiconductor element,
    wherein the vertical structure element is laterally surrounded by a filling material that is more elastic than a material of the carrier substrate.

16. A semiconductor structure having a layer assembly comprising a carrier substrate and a semiconductor component, the semiconductor component comprising a light-emitting semiconductor layer or a light-emitting semiconductor element and two contact locations, and the carrier substrate comprising a layer sequence formed of a plurality of layers,
    wherein the semiconductor component is arranged over the carrier substrate, and
    wherein the plurality of layers of the carrier substrate are coordinated with one another in terms of thickness such that no bending moment or hardly any bending moment arises in the layer assembly when the bending moments in the carrier substrate and the semiconductor component are added.

17. The semiconductor structure as claimed in claim 16, in which as least one wetting layer, at least one reflection layer, and at least one diffusion barrier are arranged between the carrier substrate and one of the two contact locations situated nearer to the carrier substrate, wherein the at least one diffusion barrier is arranged between the at least one reflection layer and the at least one wetting layer.

18. The semiconductor structure as claimed in claim 16, in which the layers of the electrically conductive layer sequence of the carrier substrate and the light-emitting semiconductor layer are running parallel in a cross section of the semiconductor component.

19. The semiconductor structure as claimed in claim 16, in which from among said plurality of layers of the carrier substrate, a layer having a smallest thermal expansion coefficient is arranged the furthest away from the semiconductor component.

* * * * *